(12) United States Patent
Enya et al.

(10) Patent No.: US 10,601,200 B2
(45) Date of Patent: Mar. 24, 2020

(54) OPTICAL MODULE

(71) Applicant: Sumitomo Electric Industries, Ltd., Osaka (JP)

(72) Inventors: Yohei Enya, Itami (JP); Hiromi Nakanishi, Itami (JP); Tetsuya Kumano, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/998,661

(22) PCT Filed: Nov. 10, 2017

(86) PCT No.: PCT/JP2017/040579
§ 371 (c)(1),
(2) Date: Aug. 16, 2018

(87) PCT Pub. No.: WO2018/110172
PCT Pub. Date: Jun. 21, 2018

(65) Prior Publication Data
US 2019/0237932 A1  Aug. 1, 2019

(30) Foreign Application Priority Data

Dec. 16, 2016  (JP) .................................. 2016-244662

(51) Int. Cl.
*H01S 5/00*     (2006.01)
*H01S 5/40*     (2006.01)
(Continued)

(52) U.S. Cl.
CPC ........ *H01S 5/4012* (2013.01); *H01S 5/02252* (2013.01); *H01S 5/02288* (2013.01);
(Continued)

(58) Field of Classification Search
CPC ............. H01S 5/02288; H01S 5/34326; H01S 5/34333; H01S 5/34313; H01S 5/343; H01S 5/06821; H01S 5/4012; H01S 5/4025; H01S 5/4093; H01S 5/0222; H01S 5/0228; H01S 5/02248; H01S 5/02216
See application file for complete search history.

(56) References Cited

U.S. PATENT DOCUMENTS

| 6,275,317 B1 * | 8/2001 | Doerr | ................... | H04B 10/505 |
| | | | | 398/183 |
| 2002/0031153 A1 * | 3/2002 | Niwa | ..................... | B82Y 20/00 |
| | | | | 372/45.01 |

(Continued)

FOREIGN PATENT DOCUMENTS

| JP | 2001-228372 A | 8/2001 |
| JP | 2002-040350 A | 2/2002 |

(Continued)

*Primary Examiner* — Kinam Park
(74) *Attorney, Agent, or Firm* — Baker Botts L.L.P.; Michael A. Sartori

(57) ABSTRACT

An optical module includes a semiconductor laser and a linear polarizer that is disposed in an emission direction of the semiconductor laser and that is configured to transmit, of light emitted by the semiconductor laser, only light containing a linearly polarized light component in a specific direction.

12 Claims, 5 Drawing Sheets

(51) Int. Cl.
  _H01S 5/343_  (2006.01)
  _H01S 5/022_  (2006.01)
  _H01S 5/024_  (2006.01)

(52) U.S. Cl.
  CPC .......... _H01S 5/34326_ (2013.01); _H01S 5/005_ (2013.01); _H01S 5/0071_ (2013.01); _H01S 5/02216_ (2013.01); _H01S 5/02415_ (2013.01); _H01S 5/02438_ (2013.01); _H01S 5/343_ (2013.01); _H01S 5/34313_ (2013.01); _H01S 5/34333_ (2013.01); _H01S 5/4031_ (2013.01); _H01S 5/4093_ (2013.01)

(56) References Cited

U.S. PATENT DOCUMENTS

| | | | | |
|---|---|---|---|---|
| 2006/0274434 | A1* | 12/2006 | Mino | G02B 6/4214 |
| | | | | 359/811 |
| 2006/0285473 | A1* | 12/2006 | Kan | G11B 7/1275 |
| | | | | 369/112.16 |
| 2009/0097847 | A1* | 4/2009 | Hosomi | G02B 6/29367 |
| | | | | 398/43 |
| 2017/0315368 | A1* | 11/2017 | Nakanishi | G02B 27/0916 |

FOREIGN PATENT DOCUMENTS

| | | |
|---|---|---|
| JP | 2007-017925 A | 1/2007 |
| JP | 2007-065600 A | 3/2007 |
| JP | 2007-328895 A | 12/2007 |
| JP | 2008-060272 A | 3/2008 |
| JP | 2008-130611 A | 6/2008 |
| JP | 2009-093101 A | 4/2009 |
| JP | 2016-096219 A | 5/2016 |

* cited by examiner

OPTICAL MODULE

TECHNICAL FIELD

The present disclosure relates to an optical module. The present application claims priority based on Japanese Patent Application No. 2016-244662 filed on Dec. 16, 2016, the entire contents of which are incorporated herein by reference.

BACKGROUND ART

There is a known optical module that includes a semiconductor light-emitting element disposed in a package (refer to, for example, PTLs 1 to 4). Such an optical module is used as a light source for various kinds of apparatuses such as a display apparatus, an optical pickup apparatus, and an optical communication apparatus.

CITATION LIST

Patent Literature

PTL 1: Japanese Unexamined Patent Application Publication No. 2009-93101
PTL 2: Japanese Unexamined Patent Application Publication No. 2007-328895
PTL 3: Japanese Unexamined Patent Application Publication No. 2007-17925
PTL 4: Japanese Unexamined Patent Application Publication No. 2007-65600

SUMMARY OF INVENTION

An optical module according to the present disclosure includes a semiconductor laser and a linear polarizer that is disposed in an emission direction of the semiconductor laser and that is configured to transmit, of light emitted by the semiconductor laser, only light containing a linearly polarized light component in a specific direction.

DESCRIPTION OF EMBODIMENTS

Figure 1:
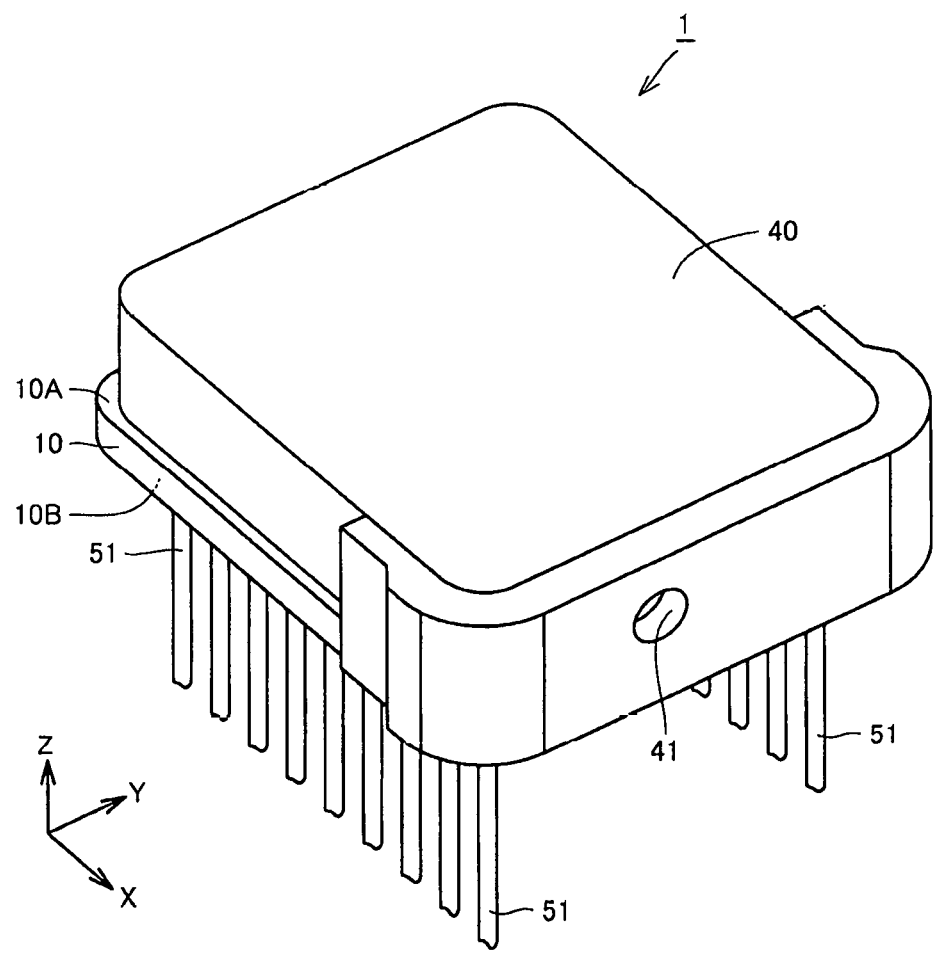
FIG. 1 is a schematic perspective view illustrating a structure of an optical module according to an embodiment.

An optical module such as that described above uses, for example, a semiconductor laser as a semiconductor light-emitting element. The light emitted by semiconductor lasers has a tendency to become elliptically polarized light. However, depending on the use of the optical module, for example, when reflection light of emitted light should also be efficiently utilized, polarized light may be required to have a high extinction ratio.

An object of the present disclosure is to provide an optical module capable of outputting light having a high extinction ratio.

Description of Embodiments of Present Disclosure

First, aspects of the present disclosure will be listed and described. An optical module according to a first aspect of the present disclosure includes a semiconductor laser and a linear polarizer that is disposed in an emission direction of the semiconductor laser and that is configured to transmit, of light emitted by the semiconductor laser, only light containing a linearly polarized light component in a specific direction.

With such a configuration, of the light emitted by the semiconductor laser, only the light that contains the linearly polarized light component and that is transmitted through the linear polarizer is output to the outside of the optical module. Therefore, the optical module according to the first aspect is capable of outputting light having a high extinction ratio.

The optical module according to the first aspect may further include a protective member that surrounds the semiconductor laser and the linear polarizer. Such a configuration makes it possible to prevent an atmosphere inside the optical module from being disturbed.

The semiconductor laser may emit red light or infrared light. The extinction ratio of each of the red light and the infrared light is low. Moreover, the temperature dependency of the polarization angle of a semiconductor laser that emits red light or infrared light is high. The optical module according to the first aspect is capable of outputting light having a high extinction ratio, even when the semiconductor laser that emits red light or infrared light is employed as the semiconductor laser.

The semiconductor laser may be a semiconductor laser that contains, as a material, a group III-V compound semiconductor in which a group V element contains at least one of arsenic and phosphorus. The extinction ratio of light emitted by such a semiconductor laser is low, and the temperature dependency of the polarization angle thereof is high. However, having the configuration described above, the optical module according to the first aspect is capable of outputting light having a high extinction ratio, even when the semiconductor laser that contains, as the material, the group III-V compound semiconductor is employed.

An optical module according to a second aspect of the present disclosure includes a semiconductor laser; a linear polarizer that is disposed in an emission direction of the semiconductor laser and that is configured to transmit, of light emitted by the semiconductor laser, only light containing a linearly polarized light component in a specific direction; and a light-receiving element that is disposed in the emission direction of the semiconductor laser and opposite the semiconductor laser when viewed from the linear polarizer and that is configured to receive a portion of the light containing the linearly polarized light component and transmitted through the linear polarizer.

With such a configuration, of the light emitted by the semiconductor laser, only the light that contains the linearly polarized light component and that is transmitted through the linear polarizer is output to the outside of the optical module. Therefore, the optical module is capable of outputting light having a high extinction ratio. Here, the light-receiving element receives, of the light emitted by the semiconductor laser, a portion of the light transmitted through the linear polarizer, because the linear polarizer is disposed in the emission direction of the semiconductor laser and between the semiconductor laser and the light-receiving element. Thus, it is possible to accurately grasp the intensity of the light that is received by the light-receiving element and to accurately adjust the intensity of the light to be output after being emitted by the semiconductor laser and transmitted through the linear polarizer. Therefore, the optical module according to the second aspect is capable of outputting light that is accurately adjusted and has a high extinction ratio.

When the light-receiving element is disposed behind the semiconductor laser, in other words, at a position opposite the linear polarizer in the emission direction of the light of the semiconductor laser or when the light-receiving element is disposed in front of the linear polarizer in the emission direction of the light of the semiconductor laser, in other words, between the semiconductor laser and the linear polarizer, the light-receiving element receives light that contains a polarized light component, which is to be removed by the linear polarizer. In this case, it is not possible, when adjusting the light transmitted through the linear polarizer, to appropriately grasp the intensity of the light transmitted through the linear polarizer. In contrast, the optical module according to the second aspect makes it possible to accurately grasp the intensity of light and to use the grasped intensity for adjusting the intensity of the light, because the light that has been transmitted through the linear polarizer is received. The optical module according to the second aspect may further include a protective member that surrounds the semiconductor laser, the linear polarizer, and the light-receiving element. Such a configuration makes it possible to prevent an atmosphere inside the optical module from being disturbed.

The optical module according to the second aspect may be configured so as to further include a lens that is disposed in the emission direction of the semiconductor laser and opposite the semiconductor laser when viewed from the light-receiving element. Such a configuration makes it possible to change a spot size of the light transmitted through the linear polarizer by using the lens. Therefore, it is possible to output, from the optical module, the light having a spot size that is appropriately changed. Moreover, the lens may be configured so as to be surrounded by the protective member.

The semiconductor laser may emit red light or infrared light. The extinction ratio of each of the red light and the infrared light is low. Moreover, the temperature dependency of the polarization angle of the semiconductor laser that emits red light or infrared light is high. The optical module according to the second aspect is capable of outputting light having an accurately adjusted intensity and a high extinction ratio, even when a semiconductor laser that emits red light or infrared light is employed as the semiconductor laser.

The semiconductor laser may be a semiconductor laser that contains, as a material, a group III-V compound semiconductor in which a group V element contains at least one of arsenic and phosphorus. The extinction ratio of light emitted by such a semiconductor laser is low, and the temperature dependency of the polarization angle thereof is high. However, having the configuration described above, the optical module according to the second aspect is capable of outputting light having a high extinction ratio and whose the intensity is accurately adjusted, even when the semiconductor laser that contains, as the material, the group III-V compound semiconductor is employed.

Details of Embodiments of Present Disclosure

Figure 2:
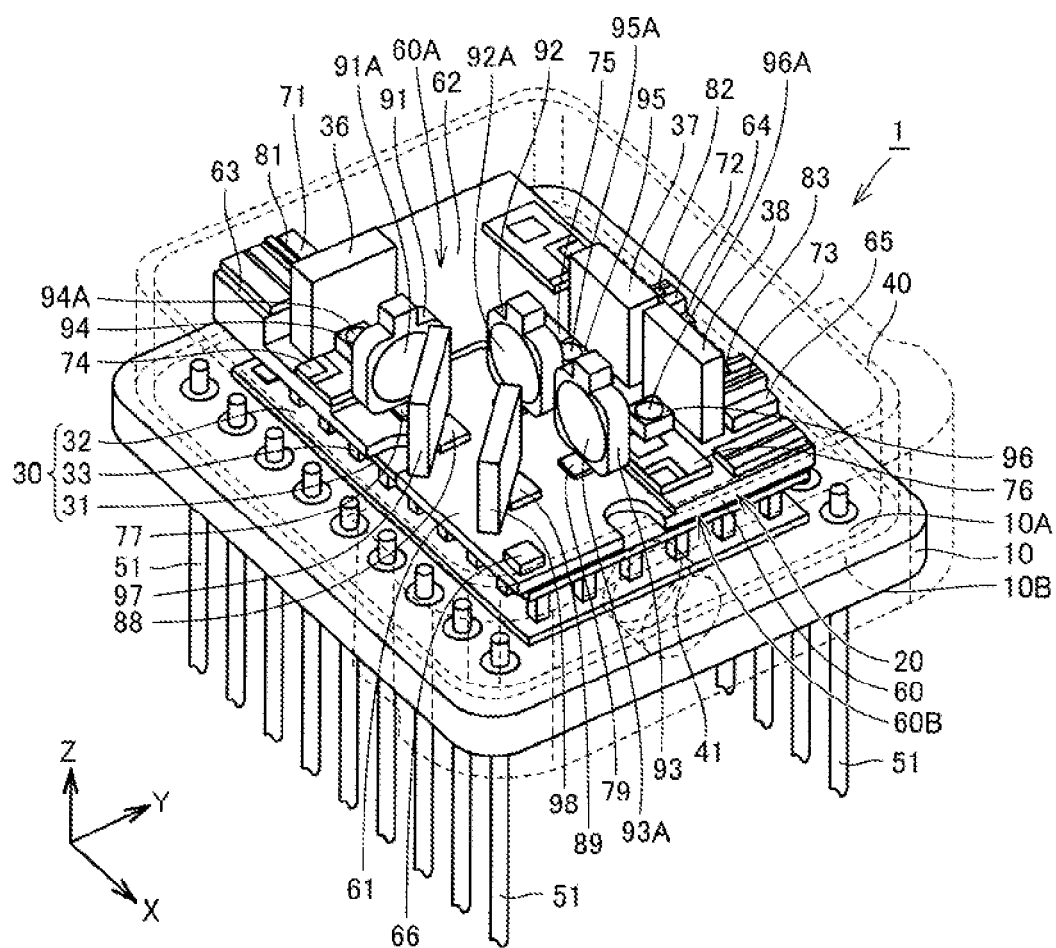
FIG. 2 is a schematic perspective view illustrating an internal structure of the optical module according to the embodiment.

Next, an embodiment of the optical module according to the present disclosure will be described with reference to FIGS. 1 to 7. FIG. 2 is a view corresponding to a state in which a cap 40 in FIG. 1 is removed. In the following drawings, like numerals denote like or corresponding portions, and description of such portions is sometimes omitted.

Referring to FIGS. 1 and 2, an optical module 1 according to the present embodiment includes a base portion 10 that has a flat-plate shape; a light-forming portion 20 that is disposed on one main surface 10A of the base portion 10 and that forms light; the cap 40 that is disposed on and in contact with the one main surface 10A of the base portion 10 so as to cover the light-forming portion 20; and a plurality of lead pins 51 that pass through the base portion 10 from the side of another main surface 10B thereof to the side of the one main surface 10A and that protrude on both sides of the one main surface 10A and the other main surface 10B. The base portion 10 and the cap 40 are in an air-tight state by, for example, being welded to each other. In other words, the light-forming portion 20 is hermetically sealed by the base portion 10 and the cap 40. A space surrounded by the base portion 10 and the cap 40 is filled with a gas, such as dry air, in which moisture is reduced (removed). An emission window 41 that transmits the light from the light-forming portion 20 is formed in the cap 40. The emission window may have a flat-plate shape having main surfaces parallel to each other or may have a lens shape that collects or diffuses the light from the light-forming portion 20. The base portion 10 and the cap 40 constitute a protective member.

Figure 3:
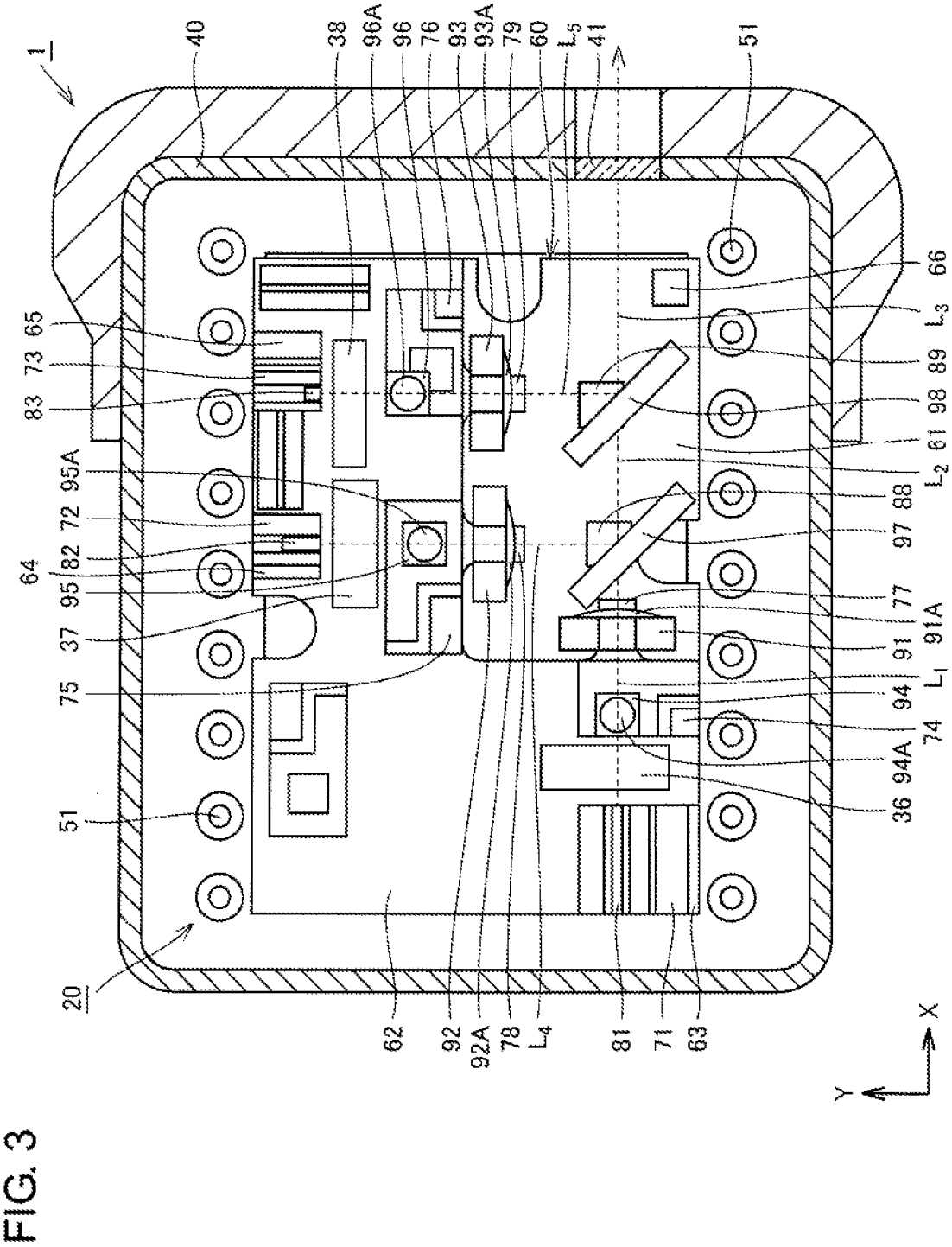
FIG. 3 is a schematic plan view illustrating the structure of the optical module according to the embodiment.

Referring to FIGS. 2 and 3, the light-forming portion 20 includes a base plate 60 that has a plate shape. The base plate 60 has one main surface 60A having a rectangular shape in plan view. The base plate 60 includes a base region 61 and a chip mount region 62. The chip mount region 62 is formed in a region that includes a short side of the one main surface 60A and a long side thereof connected to the short side. The thickness of the chip mount region 62 is large compared with the base region 61. As a result, compared with the base region 61, the height of the chip mount region 62 is large. A first chip-mount region 63, which is a region having a large thickness (large height) compared with adjacent regions, is formed in the chip mount region 62 so as to be on a side of the region opposite the side where the short side is connected to the long side. A second chip-mount region 64 and a third chip-mount region 65, which are regions each having a large thickness (large height) compared with adjacent regions, are formed in the chip mount region 62 with a space therebetween so as to be on a side of the region opposite the side where the long side is connected to the short side.

A flat-plate shaped first sub-mount 71 is disposed on the first chip-mount region 63. A red laser diode 81 as a first semiconductor light-emitting element is disposed on the first sub-mount 71. A flat-plate shaped second sub-mount 72 is disposed on the second chip-mount region 64. A green laser diode 82 as a second semiconductor light-emitting element is disposed on the second sub-mount 72. A flat-plate shaped third sub-mount 73 is disposed on the third chip-mount region 65. A blue laser diode 83 as a third semiconductor light-emitting element is disposed on the third sub-mount 73. The height (distance between a reference surface and each optical axis, with the one main surface 60A of the base plate 60 as the reference surface; distance with respect to the reference surface in a Z-axis direction) of each of an optical axis of the red laser diode 81, an optical axis of the green laser diode 82, and an optical axis of the blue laser diode 83 is adjusted by the first sub-mount 71, the second sub-mount 72, or the third sub-mount 73 corresponding thereto such that the optical axes coincide with each other.

A fourth sub-mount 74, a fifth sub-mount 75, and a sixth sub-mount 76 are disposed on the base region 61 of the base plate 60. A first photodiode 94 as a first light-receiving element, a second photodiode 95 as a second light-receiving element, and a third photodiode 96 as a third light-receiving element are disposed on the fourth sub-mount 74, the fifth sub-mount 75, and the sixth sub-mount 76, respectively. The height (distance to the optical axis of each of the red laser diode 81, the green laser diode 82, and the blue laser diode 83; distance in the Z-axis direction) of each of the first photodiode 94, the second photodiode 95, and the third photodiode 96 is adjusted by the fourth sub-mount 74, the fifth sub-mount 75, or the sixth sub-mount 76 corresponding thereto. The first photodiode 94, the second photodiode 95, and the third photodiode 96 are disposed at a position at which the first photodiode 94 receives light from the red laser diode 81, a position at which the second photodiode 95 receives light from the green laser diode 82, and a position at which the third photodiode 96 receives light from the blue laser diode 83, respectively. In the present embodiment, the light-receiving elements are disposed so as to correspond to respective semiconductor light-emitting elements. The first photodiode 94 is a photodiode capable of receiving red light, the second photodiode 95 is a photodiode capable of receiving green light, and the third photodiode 96 is a photodiode capable of receiving blue light. The wavelength of red is, for example, from 620 nm to 660 nm, inclusive. The wavelength of green is, for example, from 510 nm to 550 nm, inclusive. The wavelength of blue is, for example, from 430 nm to 470 nm, inclusive. The first photodiode 94 is disposed between the red laser diode 81 and a first lens 91 in an emission direction of the red laser diode 81. The second photodiode 95 is disposed between the green laser diode 82 and a second lens 92 in an emission direction of the green laser diode 82. The third photodiode 96 is disposed between the blue laser diode 83 and a third lens 93 in an emission direction of the blue laser diode 83.

A first polarizer 36, a second polarizer 37, and a third polarizer 38, which are linear polarizers, are disposed on the chip mount region 62. The first polarizer 36 transmits, of light of the red laser diode 81, only light that contains a linearly polarized light component in a specific direction. The second polarizer 37 transmits, of light of the green laser diode 82, only light that contains a linearly polarized light component in a specific direction. The third polarizer 38 transmits, of light of the blue laser diode 83, only light that contains a linearly polarized light component in a specific direction. The polarization axis of each of the first polarizer 36, the second polarizer 37, and the third polarizer 38 is preferably, for example, 0±3° or 90±3° with respect to a bottom surface (reference surface) of the base portion 10. The polarization axis of each of the first polarizer 36, the second polarizer 37, and the third polarizer 38 is more preferably 0±1° or 90±1°. Each of the first polarizer 36, the second polarizer 37, and the third polarizer 38 has a flat-plate shape. The first polarizer 36 has a rectangular shape when viewed in an X-axis direction. Each of the second polarizer 37 and the third polarizer 38 has a rectangular shape when viewed in a Y-axis direction. Each of the first polarizer 36, the second polarizer 37, and the third polarizer 38 is disposed on the chip mount region 62 such that a region thereof corresponding to one side of the rectangular shape is in contact with the chip mount region 62. The first polarizer 36 is disposed in the emission direction of the red laser diode 81 and between the red laser diode 81 and the first photodiode 94. The second polarizer 37 is disposed between the green laser diode 82 and the second photodiode 95. The third polarizer 38 is disposed between the blue laser diode 83 and the third photodiode 96.

A first lens holding portion 77, a second lens holding portion 78, and a third lens holding portion 79, which are protruding portions, are formed on the base region 61 of the base plate 60. The first lens 91, the second lens 92, and the third lens 93 are disposed on the first lens holding portion 77, the second lens holding portion 78, and the third lens holding portion 79, respectively. In other words, the first lens 91 is disposed in the emission direction of the red laser diode 81 and opposite the red laser diode 81 when viewed from the first photodiode 94. The second lens 92 is disposed in the emission direction of the green laser diode 82 and opposite the green laser diode 82 when viewed from the second photodiode 95. The third lens 93 is disposed in the emission direction of the blue laser diode 83 and opposite the blue laser diode 83 when viewed from the third photodiode 96. The first lens 91, the second lens 92, and the third lens 93 respectively include a lens portion 91A, a lens portion 92A, and a lens portion 93A each having a surface as a lens surface. The lens portion 91A of the first lens 91, the lens portion 92A of the second lens 92, and the lens portion 93A of the third lens 93 are integrally formed with a region thereof other than the lens portion 91A, a region thereof other than the lens portion 92A, and a region thereof other than the lens portion 93A, respectively. The central axis of the lens portion 91A of the first lens 91, the central axis of the lens portion 92A of the second lens 92, and the central axis of the lens portion 93A of the third lens 93, that is, the optical axis of the lens portion 91A, the optical axis of the lens portion 92A, and the optical axis of the lens portion 93A are adjusted by the first lens holding portion 77, the second lens holding portion 78, and the third lens holding portion 79, respectively, so as to coincide with the optical axis of the red laser diode 81, the optical axis of the green laser diode 82, and the optical axis of the blue laser diode 83, respectively. The first lens 91, the second lens 92, and the third lens 93 change a spot size of light emitted by the red laser diode 81, a spot size of light emitted by the green laser diode 82, and a spot size of light emitted by the blue laser diode 83, respectively. The spot size of the light emitted by the red laser diode 81, the spot size of the light emitted by the green laser diode 82, and the spot size of the light emitted by the blue laser diode 83 are changed by the first lens 91, the second lens 92, and the third lens 93, respectively, so as to coincide with each other.

A first filter 97 and a second filter 98 are disposed on the base region 61 of the base plate 60. Each of the first filter 97 and the second filter 98 has a flat-plate shape having main surfaces parallel to each other. The first filter 97 and the second filter 98 are, for example, wavelength-selective filters. The first filter 97 and the second filter 98 are dielectric multilayer film filters. More specifically, the first filter 97 transmits red light and reflects green light. The second filter 98 transmits red light and green light and reflects blue light.

Thus, each of the first filter 97 and the second filter 98 selectively transmits and reflects light of specific wavelengths. As a result, the first filter 97 and the second filter 98 combine the light emitted by the red laser diode 81, the light emitted by the green laser diode 82, and the light emitted by the blue laser diode 83 with each other. The first filter 97 and the second filter 98 are disposed respectively on a first protruding region 88 and a second protruding region 89, which are protruding portions formed on the base region 61.

The optical module 1 includes an electronic cooling module (hereinafter, sometimes referred to as a thermo-electric cooler (TEC)) 30 between the base portion 10 and the base plate 60. In addition, the optical module 1 includes a thermistor 66. The thermistor 66, which is used for detecting the temperature of the base plate 60, is disposed on the base region 61. The TEC 30 includes a heat absorption plate 31, a heat dissipation plate 32, and semiconductor pillars 33 that are disposed between the heat absorption plate 31 and the heat dissipation plate 32 with an electrode interposed therebetween. The heat absorption plate 31 and the heat dissipation plate 32 are formed of, for example, alumina. The heat absorption plate 31 is disposed so as to be in contact with another main surface 60B of the base plate 60. The heat dissipation plate 32 is disposed so as to be in contact with the one main surface 10A of the base portion 10. In the present embodiment, the TEC 30 is a Peltier module (Peltier element). When current flows through the TEC 30, the heat of the base plate 60 in contact with the heat absorption plate 31 transfers to the base portion 10, and the base plate 60 is thereby cooled. The provision of the TEC 30 makes it possible to adjust the temperature of the red laser diode 81, the temperature of the green laser diode 82, and the temperature of the blue laser diode 83 by cooling the red laser diode 81, the green laser diode 82, and the blue laser diode 83 disposed on the base plate 60, respectively.

Referring to FIG. 3, the red laser diode 81, the first polarizer 36, a light-receiving portion 94A of the first photodiode 94, the lens portion 91A of the first lens 91, the first filter 97, and the second filter 98 are disposed next to each other (next to each other in the X-axis direction) along a straight line extending in the emission direction of the light of the red laser diode 81. The green laser diode 82, the second polarizer 37, a light-receiving portion 95A of the second photodiode 95, the lens portion 92A of the second lens 92, and the first filter 97 are disposed next to each other (next to each other in the Y-axis direction) along a straight line extending in the emission direction of the light of the green laser diode 82. The blue laser diode 83, the third polarizer 38, a light-receiving portion 96A of the third photodiode 96, the lens portion 93A of the third lens 93, and the second filter 98 are disposed next to each other (next to each other in the Y-axis direction) along a straight line extending in the emission direction of the light of the blue laser diode 83. In other words, the emission direction of the red laser diode 81 crosses the emission direction of the green laser diode 82 and the emission direction of the blue laser diode 83. More specifically, the emission direction of the red laser diode 81 is perpendicular to the emission direction of the green laser diode 82 and the emission direction of the blue laser diode 83. The emission direction of the green laser diode 82 is a direction along the emission direction of the blue laser diode 83. More specifically, the emission direction of the green laser diode 82 and the emission direction of the blue laser diode 83 are parallel to each other. The main surfaces of the first filter 97 and the second filter 98 are inclined with respect to the emission direction of the light of the red laser diode 81. More specifically, the main surfaces of the first filter 97 and the second filter 98 are inclined 45° with respect to the emission direction (X-axis direction) of the light of the red laser diode 81.

Next, operation of the optical module 1 according to the present embodiment will be described. Referring to FIG. 3, the red light emitted by the red laser diode 81 reaches the first polarizer 36. The first polarizer 36 transmits, of the light emitted by the red laser diode 81, only light containing a linearly polarized light component in a specific direction. At this time, of the red light, the transmitted light containing the linearly polarized light component in the specific direction travels along an optical path $L_1$. A portion of the light containing the linearly polarized light component in the specific direction of the red is made incident on the light-receiving portion 94A of the first photodiode 94. Thus, of the red light emitted by the red laser diode 81, the intensity of the light containing the linearly polarized light component in the specific direction of the red is grasped, and on the basis of a difference between the grasped intensity of the light containing the linearly polarized light component in the specific direction and an intensity of a target red light that should be emitted, the intensity of the light containing the linearly polarized light component in the specific direction of the red is adjusted. After passing above the first photodiode 94, the light that contains the linearly polarized light component in the specific direction of the red is made incident on the lens portion 91A of the first lens 91, and the spot size of the light is changed. Specifically, for example, of the red light emitted by the red laser diode 81, the light containing the linearly polarized light component in the specific direction of the red is changed into collimated light. The light that contains the linearly polarized light component in the specific direction of the red and that has the spot size changed in the first lens 91 travels along the optical path $L_1$ and is made incident on the first filter 97. The light containing the linearly polarized light component in the specific direction of the red emitted by the red laser diode 81 additionally travels along an optical path $L_2$ and is made incident on the second filter 98, because the first filter 97 transmits the red light. Then, the light containing the linearly polarized light component in the specific direction of the red emitted by the red laser diode 81 additionally travels along an optical path $L_3$ and exits to the outside of the optical module 1 through the emission window 41 of the cap 40, because the second filter 98 transmits the red light.

The green light emitted by the green laser diode 82 reaches the second polarizer 37. The second polarizer 37 transmits, of the light emitted by the green laser diode 82, only light containing a linearly polarized light component in a specific direction. At this time, of the green light, the transmitted light containing the linearly polarized light component in the specific direction travels along an optical path $L_4$. A portion of the light containing the linearly polarized light component in the specific direction of the green is made incident on the light-receiving portion 95A of the second photodiode 95. Thus, of the green light emitted by the green laser diode 82, the intensity of the light containing the linearly polarized light component in the specific direction of the green is grasped, and on the basis of a difference between the grasped intensity of the light containing the linearly polarized light component in the specific direction and an intensity of a target green light that should be emitted, the intensity of the light containing the linearly polarized light component in the specific direction of the green is adjusted. After passing above the second photodiode 95, the light that contains the linearly polarized light component in the specific direction of the green is made incident on the lens portion 92A of the second lens 92, and the spot size of the light is changed. Specifically, for example, of the green light emitted by the green laser diode 82, the light containing the linearly polarized light component in the specific direction of the green is changed into collimated light. The light that contains the linearly polarized light component in the specific direction of the green and that has the spot size changed in the second lens 92 travels along the optical path $L_4$ and is made incident on the first filter 97. The light containing the linearly polarized light component in the specific direction of the green emitted by the green laser diode 82 enters the optical path $L_2$, because the first filter 97 reflects the green light. As a result, after being combined with the light containing the linearly polarized light component in the specific direction of the red, the light containing the linearly polarized light component in the specific direction of the green travels along the optical path $L_2$ and is made incident on the second filter 98. The light containing the linearly polarized light component in the specific direction of the green emitted by the green laser diode 82 additionally travels along the optical path $L_3$ and exits to the outside of the optical module 1 through the emission window 41 of the cap 40, because the second filter 98 transmits the green light.

The blue light emitted by the blue laser diode 83 reaches the third polarizer 38. The third polarizer 38 transmits, of the light emitted by the blue laser diode 83, only light containing a linearly polarized light component in a specific direction. At this time, of the blue light, the transmitted light containing the linearly polarized light component in the specific direction travels along an optical path $L_5$. A portion of the light containing the linearly polarized light component in the specific direction of the blue is made incident on the light-receiving portion 96A of the third photodiode 96. Thus, of the blue light emitted by the blue laser diode 83, the intensity of the light containing the linearly polarized light in the specific direction of the blue is grasped, and on the basis of a difference between the grasped intensity of the light containing the linearly polarized light component in the specific direction and an intensity of a target blue light that should be emitted, the intensity of the light containing the linearly polarized light component in the specific direction of the blue is adjusted. After passing above the second photodiode 95, the light that contains the linearly polarized light component in the specific direction of the blue is made incident on the lens portion 93A of the third lens 93, and the spot size of the light is changed. Specifically, for example, of the blue light emitted by the blue laser diode 83, the light containing the linearly polarized light component in the specific direction of the blue is changed into collimated light. The light that contains the linearly polarized light component in the specific direction of the blue and that has the spot size changed in the third lens 93 travels along the optical path $L_5$ and is made incident on the second filter 98. The light containing the linearly polarized light component in the specific direction of the blue emitted by the blue laser diode 83 enters the optical path $L_3$, because the second filter 98 reflects the blue light. As a result, after being combined with the light containing the linearly polarized light component in the specific direction of the red and the light containing the linearly polarized light component in the specific direction of the green, the light containing the linearly polarized light component in the specific direction of the blue travels along the optical path $L_3$ and exits to the outside of the optical module 1 through the emission window 41 of the cap 40.

Thus, the light formed by combining the light containing the linearly polarized light component in the specific direction of the red, the light containing the linearly polarized light component in the specific direction of the green, and the light containing the linearly polarized light component in the specific direction of the blue is emitted through the emission window 41 of the cap 40. Therefore, it is possible to output light having a high extinction ratio. Here, in the optical module 1 according to the present embodiment, of the light emitted by the red laser diode 81, a portion of the light containing the linearly polarized light component in the specific direction and transmitted through the first polarizer 36 is received by the first photodiode 94; of the light emitted by the green laser diode 82, a portion of the light containing the linearly polarized light component in the specific direction and transmitted through the second polarizer 37 is received by the second photodiode 95; and of the light emitted by the blue laser diode 83, a portion of the light containing the linearly polarized light component in the specific direction and transmitted through the third polarizer 38 is received by the third photodiode 96. Thus, the first photodiode 94 receives, of the light emitted by the red laser diode 81, the light transmitted through the first polarizer 36; the second photodiode 95 receives, of the light emitted by the green laser diode 82, the light transmitted through the second polarizer 37; and the third photodiode 96 receives, of the light emitted by the blue laser diode 83, the light transmitted through the third polarizer 38, which makes it possible to accurately adjust the intensity of the light to be output from the optical module 1 after being emitted by the red laser diode 81, the green laser diode 82, and the blue laser diode 83 and being transmitted through the first polarizer 36, the second polarizer 37, and the third polarizer 38, respectively, by accurately grasping the intensity of the light that is received by each of the first photodiode 94, the second photodiode 95, and the third photodiode 96. Therefore, the aforementioned optical module 1 is capable of outputting light having a high extinction ratio and whose the intensity is accurately adjusted. In this case, the red light, the green light, and the blue light are accurately combined with each other at a desired intensity ratio, which makes it possible to accurately form light of a desired color.

Here, the inventors of the present application focused on a tendency for the light that is output by the semiconductor laser to become elliptically polarized light. In particular, the inventors focused on the fact that, regarding the light output by the red laser diode 81, the highest limit of the extinction ratio of emitted light is 1:20 and that an increase in the extinction ratio is thus required. When the light output by the semiconductor laser is utilized by, for example, causing the light to be reflected by a mirror, reflectance by the mirror and the like are affected by the extinction ratio if the extinction ratio is low, because of a relationship between an s-polarized light component and a p-polarized light component contained in the elliptically polarized light. That is, output of light having a high extinction ratio is required. Specifically, output of light having a high extinction ratio of at least 1:5000 is required.

Figure 4:
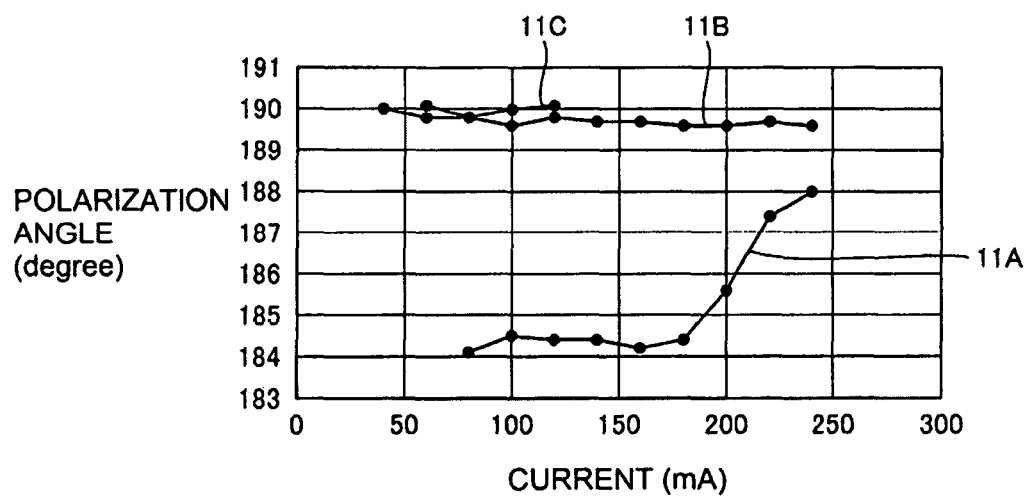
FIG. 4 is a graph showing a relationship between current supplied to a red laser diode, a green laser diode, and a blue laser diode and a polarization angle of each color.

In addition, the inventors of the present application focused on a relationship between current supplied to each laser diode and polarization angle. Next, the relationship between the current supplied to each laser diode and the polarization angle will be described. FIG. 4 is a graph showing a relationship between current supplied to each of the red laser diode 81, the green laser diode 82, and the blue laser diode 83 and the polarization angle of each color. In FIG. 4, the vertical axis indicates polarization angle (degrees) and the horizontal axis indicates current (milliamperes (mA)) supplied to the laser diodes of each color. In FIG. 4, line 11A indicates the polarization angle and the current for the red laser diode 81, line 11B indicates the polarization angle and the current for the green laser diode 82, and line 11C indicates the polarization angle and the current for the blue laser diode 83. Referring to FIG. 4, regarding the polarization angle and the current for the green laser diode 82 and the blue laser diode 83, the polarization angle is substantially constant, even when the temperature in an environment in which each laser diode is disposed changes, and the current supplied to each laser diode is changed in order to obtain a constant optical output with respect to the change in the temperature. In contrast, regarding the polarization angle and the current for the red laser diode 81, the polarization angle changes greatly in some circumstances when the supplied current is changed. In other words, in terms of the output of the polarization angle, the temperature dependency of the output of the red laser diode 81 is high.

Thus, the light output by the red laser diode 81 is caused to be transmitted through the linear polarizer that transmits only the light containing the linearly polarized light component in the specific direction so that the light of the red laser diode 81 having an increased extinction ratio is output.

Figure 5:
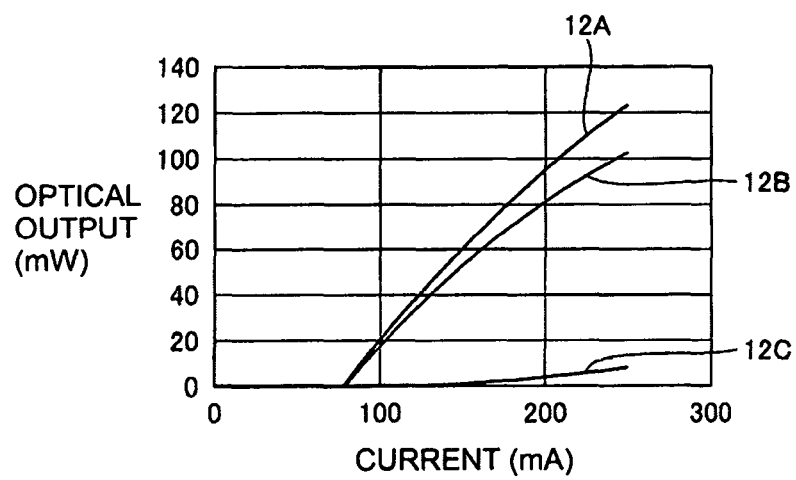
FIG. 5 is a graph showing a relationship between current supplied to the red laser diode and an optical output of the red laser diode.

Here, when the first polarizer 36 is disposed in the emission direction of the light of the red laser diode 81 to obtain an output, an optical loss occurs due to the first polarizer 36. FIG. 5 is a graph showing a relationship between current supplied to the red laser diode 81 and an optical output of the red laser diode 81. In FIG. 5, the vertical axis indicates the optical output (milliwatts (mW)) of the red laser diode 81, and the horizontal axis indicates current (mA) supplied to the red laser diode 81. In FIG. 5, line 12A indicates total output of the optical output, line 12B indicates a lateral-direction polarized light component of the optical output, and line 12C indicates a vertical-direction polarized light component of the optical output. Referring to FIG. 5, when the supplied current increases, the polarization angle changes by rotating. Thus, in accordance with the supplied current, a ratio between the lateral-direction polarized light component and the vertical-direction polarized light component in the total output of the optical output changes. Specifically, as the supplied current increases, the ratio of the lateral-direction polarized light component relative to the total output of the optical output decreases, and the ratio of the vertical-direction polarized light component relative to the total output of the optical output increases. Thus, the change in the ratio between the lateral-direction polarized light component and the vertical-direction polarized light component in accordance with the supplied current affects reflectance when, for example, reflected light reflected by a mirror is utilized.

Figure 6:
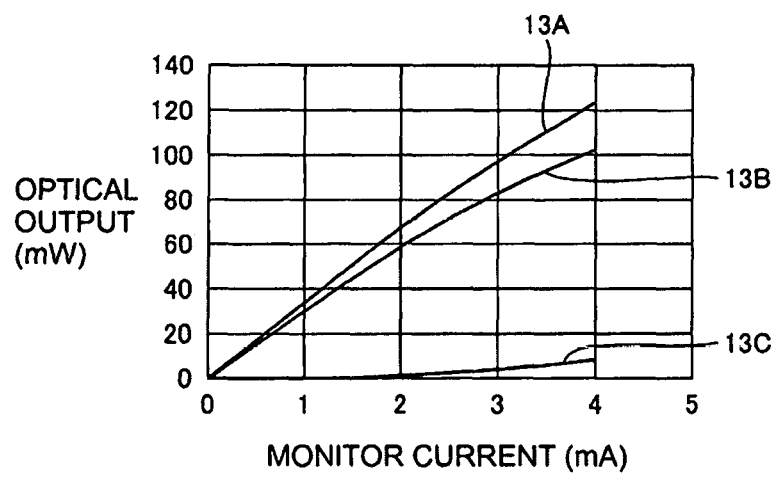
FIG. 6 is a graph showing a relationship between the optical output of the red laser diode and monitor current of light received by a first photodiode.

FIG. 6 is a graph showing a relationship between the optical output of the red laser diode 81 and monitor current of the light received by the first photodiode 94. In FIG. 6, the vertical axis indicates the optical output (mW) of the red laser diode 81, and the horizontal axis indicates the monitor current (mA) of the light. In FIG. 6, line 13A indicates the total output of the optical output, line 13B indicates the lateral-direction polarized light component of the optical output, and line 13C indicates the vertical-direction polarized light component of the optical output. With respect to the graph in FIG. 6, the first photodiode 94 is disposed at a position opposite the emission direction of the red laser diode 81. Thus, the red light emitted by the red laser diode 81 is received by a rear monitor.

Referring to FIG. 6, the monitor current of the light received by the first photodiode 94 increases as the optical output increases. Thus, as the optical output increases, the ratio of the monitor current corresponding to the vertical-direction polarized light component increases, and the ratio of the monitor current corresponding to the lateral-direction polarized light component decreases. In such a state, linearity in the relationship between the monitor current and the optical output decreases. In this case, output variation in the optical output increases, which makes it difficult to accurately perform output when controlling, by using an automatic power control (APC) circuit (not shown), the current to be supplied in accordance with the monitor current. Therefore, the configuration of the optical module 1 according to the present embodiment is employed.

Figure 7:
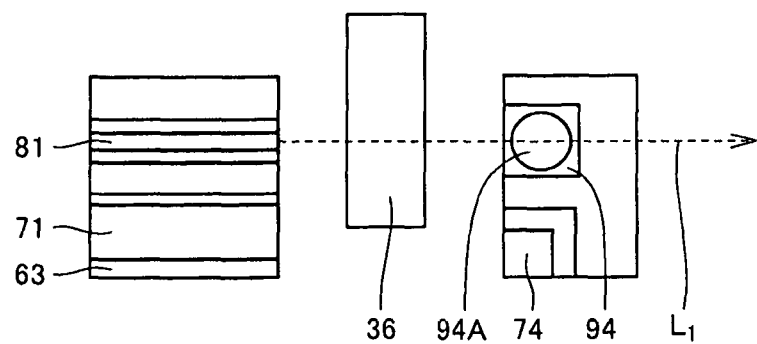
FIG. 7 is a view illustrating an arrangement state of the red laser diode, a first polarizer, and the first photodiode.

FIG. 7 is a view illustrating an arrangement state of the red laser diode 81, the first polarizer 36, and the first photodiode 94. As illustrated in FIG. 7, in the optical module 1 according to the present embodiment, the first photodiode 94 is disposed at the rear of the first polarizer 36 in the emission direction of the light of the red laser diode 81. Thus, the first photodiode 94 receives only the light that contains the linearly polarized light component in the specific direction. Therefore, it is possible to make the relationship between the monitor current and the optical output linear. As a result, it is possible to control, by using the APC, the current to be supplied. In this case, an optical loss occurs because only the light that contains the linearly polarized light component and that has been transmitted through the first polarizer 36 is utilized for the output of the red laser diode 81. However, it is possible to compensate the optical loss because the light containing the linearly polarized light component and transmitted through the first polarizer 36 is monitored, and the optical output is performed on the basis of the light that contains the linearly polarized light component and that is transmitted through the first polarizer 36. Moreover, it is possible to compensate a decrease in the linear characteristic, that is, the linearity between the current to be supplied and the optical output.

Accordingly, the optical module 1 according to the present embodiment is capable of outputting light that is accurately adjusted and that has a high extinction ratio.

Note that, in the aforementioned embodiment, the first photodiode 94, the second photodiode 95, and the third photodiode 96 are disposed on the base plate 60; however, the arrangement thereof is not limited thereto, and the first photodiode 94, the second photodiode 95, and the third photodiode 96 may be disposed outside the base plate 60. More specifically, the first photodiode 94, the second photodiode 95, and the third photodiode 96, which are light-receiving elements, may be disposed outside the optical module 1. In other words, it is possible to make the relationship between the monitor current and the optical output linear by monitoring the light output from the optical module 1. As a result, it is possible to control, by using the APC, the current to be supplied. When the light-receiving elements are disposed outside the optical module 1, it is possible to design the optical module 1 so as to be smaller.

In addition, in the aforementioned embodiment, the optical module 1 has a configuration in which the red laser diode 81, the green laser diode 82, and the blue laser diode 83 are provided as semiconductor lasers; however, the configuration is not limited thereto, and the configuration may include the laser diode of any one of the colors, in other words, at least one of the red laser diode 81, the green laser diode 82, and the blue laser diode 83.

Note that, in the aforementioned embodiment, the semiconductor laser may be the laser that contains, as the material, the group III-V compound semiconductor in which a group V element contains at least one of arsenic and phosphorus. In other words, the material that constitutes a light-emitting layer may be the group III-V compound semiconductor.

The embodiment disclosed herein is an example in all features and should be understood as a non-limiting example in every aspect. The scope of the present invention is prescribed by the claims, not by the aforementioned description, and intends to include all modifications within the concept and the scope equivalent to the claims.

REFERENCE SIGNS LIST

1 OPTICAL MODULE
10 BASE PORTION
10A ONE MAIN SURFACE
10B OTHER MAIN SURFACE
20 LIGHT-FORMING PORTION
30 ELECTRONIC COOLING MODULE (TEC)
31 HEAT ABSORPTION PLATE
32 HEAT DISSIPATION PLATE
33 SEMICONDUCTOR PILLAR
36 FIRST POLARIZER
37 SECOND POLARIZER
38 THIRD POLARIZER
40 CAP
41 EMISSION WINDOW
51 LEAD PIN
60 BASE PLATE
60A ONE MAIN SURFACE
60B OTHER MAIN SURFACE
61 BASE REGION
62 CHIP MOUNT REGION
63 FIRST CHIP-MOUNT REGION
64 SECOND CHIP-MOUNT REGION
65 THIRD CHIP-MOUNT REGION
66 THERMISTOR
71 FIRST SUB-MOUNT
72 SECOND SUB-MOUNT
73 THIRD SUB-MOUNT
74 FOURTH SUB-MOUNT
75 FIFTH SUB-MOUNT
76 SIXTH SUB-MOUNT
77 FIRST LENS HOLDING PORTION
78 SECOND LENS HOLDING PORTION
79 THIRD LENS HOLDING PORTION
81 RED LASER DIODE
82 GREEN LASER DIODE
83 BLUE LASER DIODE
88 FIRST PROTRUDING REGION
89 SECOND PROTRUDING REGION
91 FIRST LENS
92 SECOND LENS
93 THIRD LENS
91A, 92A, 93A LENS PORTION
94 FIRST PHOTODIODE
95 SECOND PHOTODIODE
96 THIRD PHOTODIODE
94A, 95A, 96A LIGHT RECEIVING PORTION
97 FIRST FILTER
98 SECOND FILTER

The invention claimed is:

1. An optical module comprising:
a semiconductor laser;
a linear polarizer that is disposed in an emission direction of the semiconductor laser and that is configured to transmit, of light emitted by the semiconductor laser, only light containing a linearly polarized light component in a specific direction; and
a light-receiving element that is disposed in the emission direction of the semiconductor laser and opposite the semiconductor laser when viewed from the linear polarizer and that is configured to receive a portion of the light containing the linearly polarized light component and transmitted through the linear polarizer,
wherein the semiconductor laser, the linear polarizer, and the light-receiving element are disposed next to each other along a straight line extending in the emission direction of the light of the semiconductor laser.

2. The optical module according to claim 1, further comprising a protective member that surrounds the semiconductor laser, the linear polarizer, and the light-receiving element.

3. The optical module according to claim 1, further comprising a lens that is disposed in the emission direction of the semiconductor laser and opposite the semiconductor laser when viewed from the light-receiving element.

4. The optical module according to claim 2, further comprising a lens that is disposed in the emission direction of the semiconductor laser and opposite the semiconductor laser when viewed from the light-receiving element, wherein the lens is surrounded by the protective member.

5. The optical module according to claim 1, wherein the semiconductor laser is configured to emit red light or infrared light.

6. The optical module according to claim 1, wherein the semiconductor laser is a laser that contains, as a material, a group III-V compound semiconductor in which a group V element contains at least one of arsenic and phosphorus.

7. An optical module comprising:
a semiconductor laser;
a linear polarizer that is disposed in an emission direction of the semiconductor laser and that is configured to transmit, of light emitted by the semiconductor laser, only light containing a linearly polarized light component in a specific direction; and
a light-receiving element that is disposed in the emission direction of the semiconductor laser and opposite the semiconductor laser when viewed from the linear polarizer and that is configured to receive a portion of the light containing the linearly polarized light component and transmitted through the linear polarizer,
wherein the portion of the linearly polarized light directly enters the light-receiving element without passing through other optical components.

8. The optical module according to claim 7, further comprising a protective member that surrounds the semiconductor laser, the linear polarizer, and the light-receiving element.

9. The optical module according to claim 7, further comprising a lens that is disposed in the emission direction of the semiconductor laser and opposite the semiconductor laser when viewed from the light-receiving element.

10. The optical module according to claim 8, further comprising a lens that is disposed in the emission direction of the semiconductor laser and opposite the semiconductor laser when viewed from the light-receiving element, wherein the lens is surrounded by the protective member.

11. The optical module according to claim 7, wherein the semiconductor laser is configured to emit red light or infrared light.

12. The optical module according to claim 7, wherein the semiconductor laser is a laser that contains, as a material, a group III-V compound semiconductor in which a group V element contains at least one of arsenic and phosphorus.

* * * * *